United States Patent
Schemmel et al.

(10) Patent No.: US 11,613,159 B2
(45) Date of Patent: Mar. 28, 2023

(54) POWER PROTECTION SYSTEM FOR A POWER MODULE OF A TRANSPORT CLIMATE CONTROL SYSTEM

(71) Applicant: THERMO KING LLC, Minneapolis, MN (US)

(72) Inventors: Shawn Alan Schemmel, Prior Lake, MN (US); Diarmaid Thomas Bucke, Patrickswell (IE); Niall Lynch, Galway (IE)

(73) Assignee: Thermo King LLC, Minneapolis, MN (US)

( * ) Notice: Subject to any disclaimer, the term of this patent is extended or adjusted under 35 U.S.C. 154(b) by 131 days.

(21) Appl. No.: 16/863,172

(22) Filed: Apr. 30, 2020

(65) Prior Publication Data

US 2021/0339601 A1    Nov. 4, 2021

(51) Int. Cl.
*B60H 1/00* (2006.01)
*B60L 1/02* (2006.01)
*B60L 1/00* (2006.01)

(52) U.S. Cl.
CPC ..... *B60H 1/00535* (2013.01); *B60H 1/00428* (2013.01); *B60H 1/00642* (2013.01); *B60L 1/003* (2013.01); *B60L 1/02* (2013.01)

(58) Field of Classification Search
CPC ............ B60H 1/00535; B60H 1/00428; B60H 1/00642; B60L 1/003; B60L 1/02
USPC ........................................................ 307/9.1
See application file for complete search history.

(56) References Cited

U.S. PATENT DOCUMENTS

| | | |
|---|---|---|
| 2008/0282715 A1 | 11/2008 | Aue et al. |
| 2013/0090009 A1* | 4/2013 | Zhao ................... H01R 13/6456 439/607.01 |
| 2017/0311457 A1* | 10/2017 | Kubota ................... B60R 16/03 |
| 2019/0214769 A1* | 7/2019 | Pieknik .............. H01R 13/6395 |
| 2019/0217730 A1* | 7/2019 | Götz ................... H01R 13/506 |
| 2019/0250653 A1 | 8/2019 | Conlon |
| 2020/0053900 A1* | 2/2020 | Feurtado .............. H05K 7/1432 |
| 2020/0086744 A1* | 3/2020 | Schumacher ........... B60L 58/22 |

(Continued)

FOREIGN PATENT DOCUMENTS

| | | |
|---|---|---|
| EP | 2613617 | 7/2013 |
| EP | 3626489 | 3/2020 |
| WO | 2016/145107 | 9/2016 |

(Continued)

OTHER PUBLICATIONS

Extended European Search Report, issued in the corresponding European patent application No. 21170461.4, dated Sep. 21, 2021, 11 pages.

*Primary Examiner* — Hal Kaplan
*Assistant Examiner* — Swarna N Chowdhuri
(74) *Attorney, Agent, or Firm* — Hamre, Schumann, Mueller & Larson, P.C.

(57) ABSTRACT

A power module for a transport climate control system that supplies power to a plurality of components of the transport climate control system is provided. The power module includes a power module housing, a power terminal, and a power protection shroud. The power terminal extends through an external surface of the power module housing. The power protection shroud extends from the external surface of the power module housing. The power protection shroud includes a curved wall having a horseshoe shape that surrounds the power terminal.

17 Claims, 8 Drawing Sheets

(56) References Cited

U.S. PATENT DOCUMENTS

2021/0068299 A1* 3/2021 Haraguchi ........... H05K 7/2039

FOREIGN PATENT DOCUMENTS

| WO | 2018/0017825 | 1/2018 |
| WO | 2019/131071 | 7/2019 |

* cited by examiner

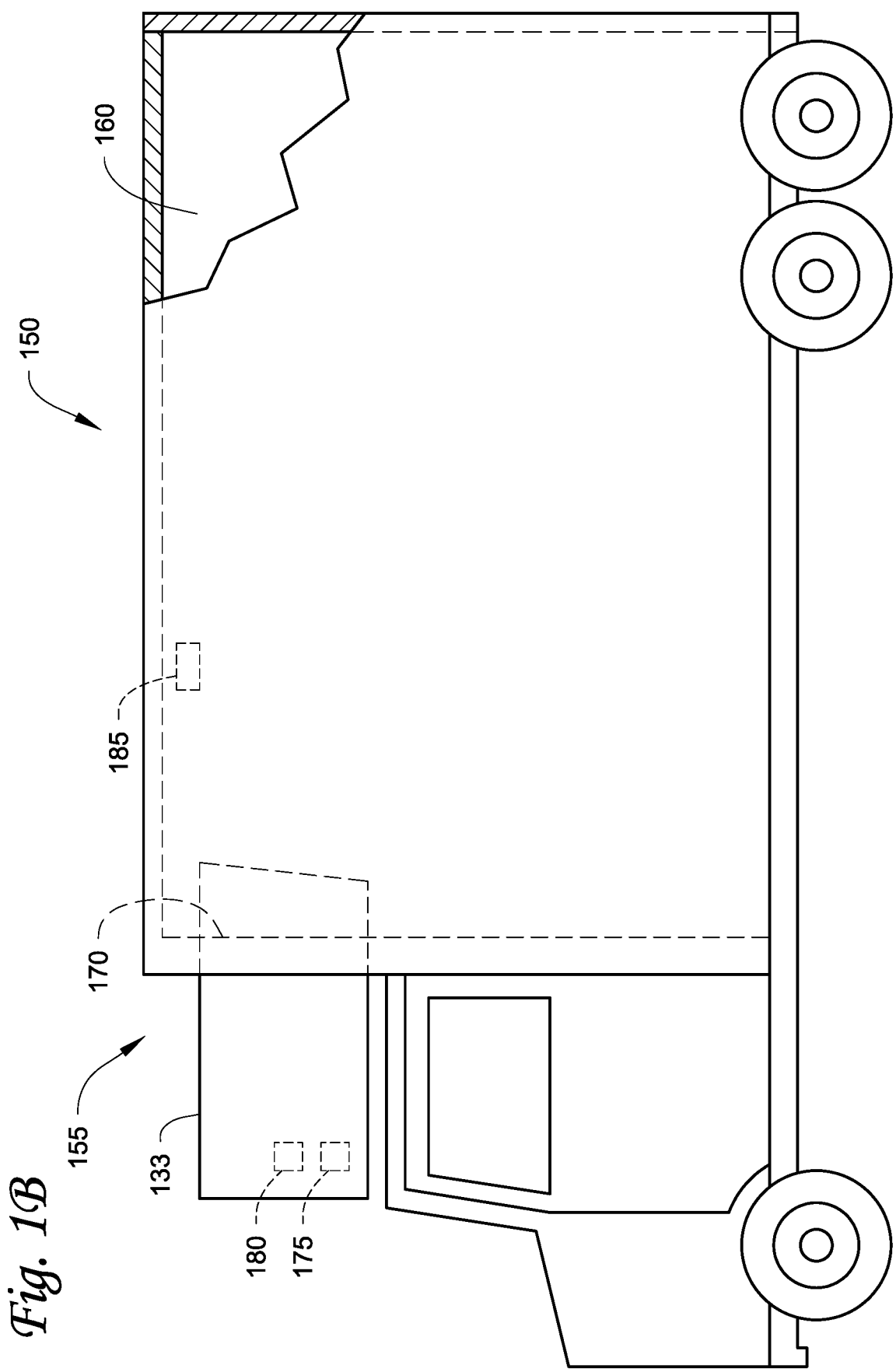

US 11,613,159 B2

POWER PROTECTION SYSTEM FOR A POWER MODULE OF A TRANSPORT CLIMATE CONTROL SYSTEM

FIELD

This disclosure relates generally to a transport climate control system. More specifically, this disclosure relates to a power protection system for a power module of a transport climate control system.

BACKGROUND

A transport climate control system is generally used to control one or more environmental conditions such as, but not limited to, temperature, humidity, air quality, or combinations thereof, of a transport unit. Examples of transport units include, but are not limited to a truck, a container (such as a container on a flat car, an intermodal container, a marine container, a rail container, etc.), a box car, a semi-tractor, a bus, or other similar transport unit. A refrigerated transport unit is commonly used to transport perishable items such as produce, frozen foods, and meat products.

SUMMARY

This disclosure relates generally to a transport climate control system. More specifically, this disclosure relates to a power protection system for a power module of a transport climate control system.

The embodiments described herein can mechanically prevent non-designated power connectors from connecting to and receiving power from a power module of a transport climate control system.

In particular, the embodiments described herein provide a power module of a transport climate control system that includes a shroud surrounding each of one or more power terminals disposed on the power module. The shroud surrounds the power terminal and limits the number of power terminal connectors that can be connected to the power terminal. Accordingly, the number of power terminal connectors that are connected to the power terminal can be controlled by the customer and thereby prevent a non-designated party from connecting an additional power terminal connector to the power terminal to divert power from authorized loads to one or more unauthorized loads.

The transport climate control system includes and is controlled by a transport climate control system controller. In some embodiments, the transport climate control system controller is a distributed controller that includes a main application controller with a human machine interface (HMI), a telematics unit, a low power module, and a high power module. The high power module can include a plurality of power terminals that are configured to supply conditioned power to one or more components of the transport climate control system.

In one embodiment, power module for a transport climate control system that supplies power to a plurality of components of the transport climate control system is provided. The power module includes a power module housing, a power terminal, and a power protection shroud. The power terminal extends through an external surface of the power module housing. The power protection shroud extends from the external surface of the power module housing. The power protection shroud includes a curved wall having a horseshoe shape that surrounds the power terminal.

In another embodiment, a transport climate control system that provides climate control within a climate controlled space of a transport unit is provided. The transport climate control system includes a climate control circuit, a transport climate control system controller and a power module. The climate control circuit includes a compressor configured to compress a working fluid passing through the climate control circuit for providing climate control within the climate controlled space of the transport unit. The transport climate control system controller is configured to control operation of the transport climate control system including the compressor. The power module is configured to supply power to a plurality of components of the transport climate control system. The power module includes a power module housing, a power terminal, and a power protection shroud. The power terminal extends through an external surface of the power module housing. The power protection shroud extends from the external surface of the power module housing. The power protection shroud includes a curved wall having a horseshoe shape that surrounds the power terminal.

BRIEF DESCRIPTION OF THE DRAWINGS

References are made to the accompanying drawings that form a part of this disclosure, and which illustrate embodiments in which the systems and methods described in this Specification can be practiced.

FIG. 1B is a side view of a truck with a transport climate control system, according to an embodiment.

Like reference numbers represent like parts throughout.

DETAILED DESCRIPTION

This disclosure relates generally to a transport climate control system. More specifically, this disclosure relates to a power protection system for a high power module of a transport climate control system controller.

A transport climate control system is generally used to control one or more environmental conditions such as, but not limited to, temperature, humidity, air quality, or combinations thereof, of a transport unit. Examples of transport units include, but are not limited to a truck, a container (such as a container on a flat car, an intermodal container, a marine container, a rail container, etc.), a box car, a semi-tractor, a bus, or other similar transport unit. A refrigerated transport unit is commonly used to transport perishable items such as pharmaceuticals, produce, frozen foods, and meat products.

A climate controlled transport unit (e.g., a transport unit including a climate control system) can be used to transport perishable items such as, but not limited to, produce, frozen foods, and meat products.

A climate control system is generally used to control one or more environmental conditions such as, but not limited to, temperature, humidity, and/or air quality of a transport unit. A climate control system includes, for example, a refrigeration system for controlling the refrigeration of a climate controlled space of a refrigerated transport unit. The climate control system may include a vapor-compressor type refrigeration system, a thermal accumulator type system, or any other suitable refrigeration system that can use refrigerant, cold plate technology, or the like.

A climate control system can include a climate control unit (CCU) attached to a transport unit to control one or more environmental conditions (e.g., temperature, humidity, air quality, etc.) of a climate controlled space of the refrigerated transport unit. The CCU can include, without limitation, a compressor, a condenser, an expansion valve, an evaporator, and one or more fans or blowers to control the heat exchange between the air within the climate controlled space and the ambient air outside of the refrigerated transport unit.

Figure 1A:
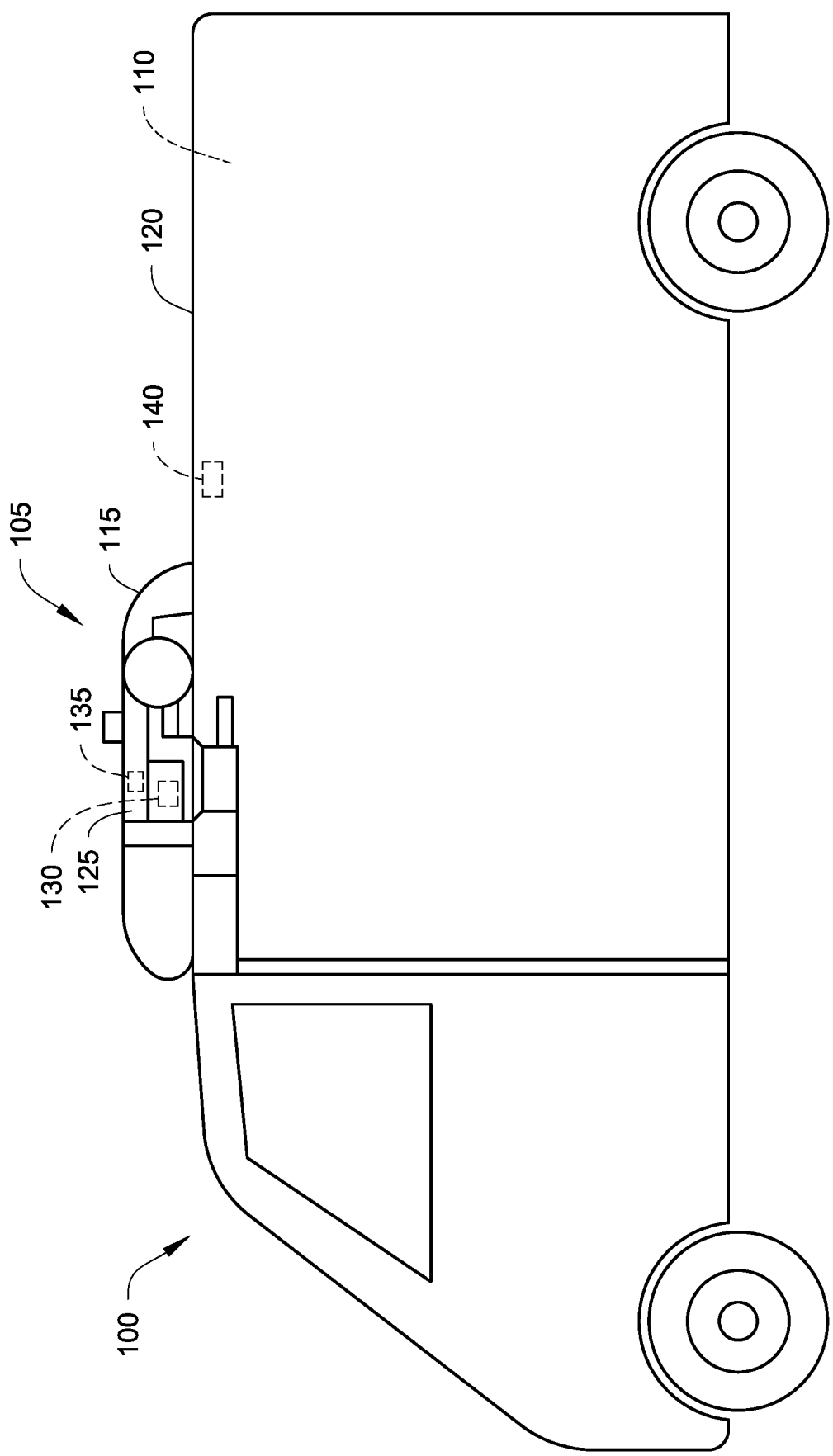
FIG. 1A is a side view of a van with a transport climate control system, according to an embodiment.
Figure 1C:
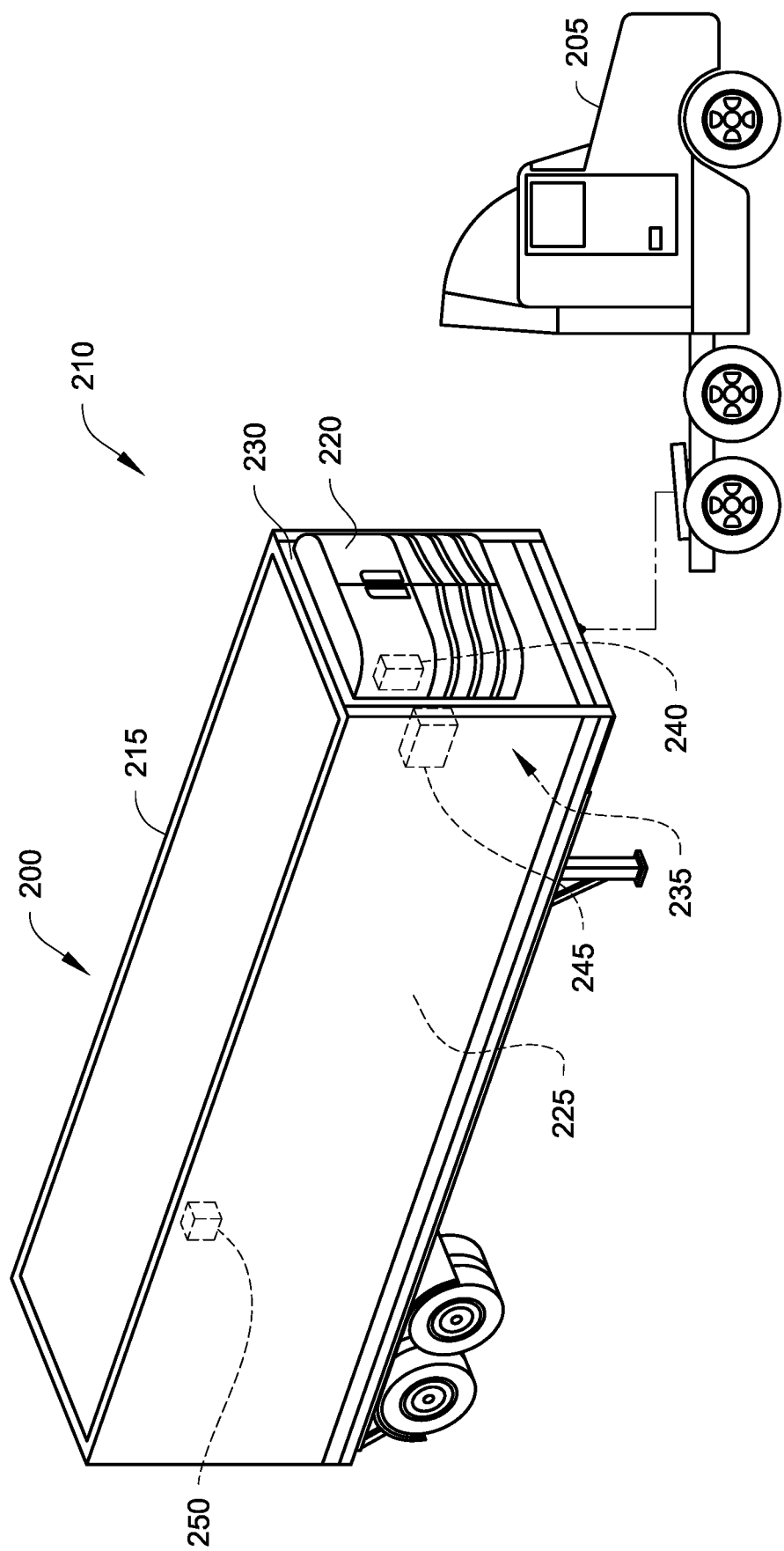
FIG. 1C is a perspective view of a climate controlled transport unit, according to an embodiment.
Figure 1D:
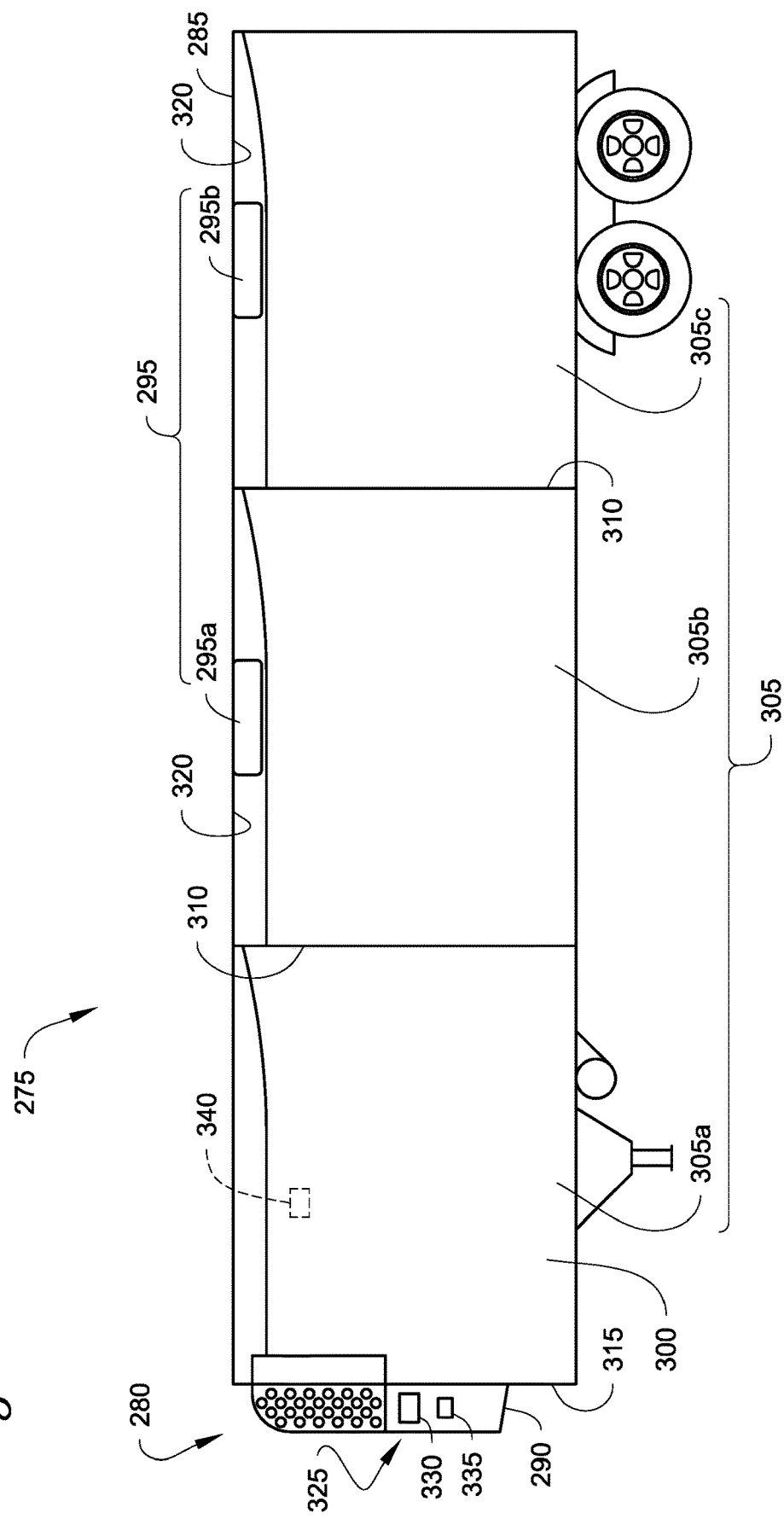
FIG. 1D is a side view of a climate controlled transport unit including a multi-zone transport climate control system, according to an embodiment.

FIGS. 1A-1D show various transport climate control systems. FIG. 1A is a side view of a van 100 with a transport climate control system 105, according to an embodiment. FIG. 1B is a side view of a truck 150 with a transport climate control system 155, according to an embodiment. FIG. 1C is a perspective view of a climate controlled transport unit 200 attachable to a tractor 205, according to an embodiment. The climate controlled transport unit 200 includes a transport climate control system 210. FIG. 1D is a side view of a climate controlled transport unit 275 including a multi-zone transport climate control system 280, according to an embodiment.

FIG. 1A depicts the van 100 having the climate control system 105 for providing climate control within a climate controlled space 110. The transport climate control system 105 includes a climate control unit (CCU) 115 that is mounted to a rooftop 120 of the van 100. In an embodiment, the CCU 115 can be a transport refrigeration unit.

The transport climate control system 105 can include, among other components, a climate control circuit (see, e.g., FIG. 2) that connects, for example, a compressor, a condenser, an evaporator, and an expansion device (e.g., an expansion valve) to provide climate control within the climate controlled space 110. It will be appreciated that the embodiments described are not limited to vans or climate-controlled vans, but can apply to any type of transport unit (e.g., a truck, a container (such as a container on a flat car, an intermodal container, a marine container, a rail container, etc.), a box car, a semi-tractor, a bus, or other similar transport unit), within the scope of the principles of this disclosure.

The transport climate control system 105 also includes a programmable climate controller 125 and one or more climate control sensors (not shown) that are configured to measure one or more parameters of the transport climate control system 105 (e.g., an ambient temperature outside of the van 100, an ambient humidity outside of the van 100, a compressor suction pressure, a compressor discharge pressure, a supply air temperature of air supplied by the CCU 115 into the climate controlled space 110, a return air temperature of air returned from the climate controlled space 110 back to the CCU 115, a humidity within the climate controlled space 110, etc.) and communicate the measured parameters to the climate controller 125. The one or more climate control sensors can be positioned at various locations outside the van 100 and/or inside the van 100 (including within the climate controlled space 110).

The climate controller 125 is configured to control operation of the transport climate control system 105 including the components of the climate control circuit. The climate controller 115 may include a single integrated control unit 130 or may include a distributed network of climate controller elements 130, 135. The number of distributed control elements in a given network can depend upon the particular application of the principles of this disclosure. The measured parameters obtained by the one or more climate control sensors can be used by the climate controller 125 to control operation of the climate control system 105. In some embodiments, the climate controller 125 can include a high power module, a low power module, a main application controller, a human machine interface, a telematics unit, etc.

The van 100 includes an independent sensor 140. In the illustrated embodiment, the independent sensor 140 is represented as a single sensor. It will be appreciated that in other embodiments, the van 100 can include a plurality of independent sensors 140. In some embodiments, the independent sensor 140 is a dedicated regulatory sensor that can provide independent verification of climate control parameters (e.g., temperature, humidity, atmosphere, etc.) within the climate controlled space 110. The independent sensor 140 is not used by the climate controller 125 to control operation of the transport climate control system 105. The independent sensor 140 is in electronic communication with a power source (not shown) of the CCU 115. In an embodiment, the independent sensor 140 is in electronic communication with the climate controller 125 (see FIG. 3 below). It will be appreciated that the electronic communication between the independent sensor 140 and the climate controller 125 can enable network communication of the sensed verification values or parameters (e.g., temperature data of cargo stored in the climate controlled space 300) measured by the independent sensor 140. The electronic communication between the climate controller 125 and the independent sensor 140 does not enable the sensed verification values or parameters to be utilized in a control of the CCU 115.

FIG. 1B depicts the climate-controlled straight truck 150 that includes the climate controlled space 160 for carrying cargo and the transport climate control system 155. The transport climate control system 155 includes a CCU 165 that is mounted to a front wall 170 of the climate controlled space 160. The CCU 165 can include, among other components, a climate control circuit (see, e.g., FIG. 2) that connects, for example, a compressor, a condenser, an evaporator, and an expansion device to provide climate control within the climate controlled space 160. In an embodiment, the CCU 165 can be a transport refrigeration unit.

The transport climate control system 155 also includes a programmable climate controller 175 and one or more climate control sensors (not shown) that are configured to measure one or more parameters of the transport climate control system 155 (e.g., an ambient temperature outside of the truck 150, an ambient humidity outside of the truck 150, a compressor suction pressure, a compressor discharge pressure, a supply air temperature of air supplied by the CCU 165 into the climate controlled space 160, a return air temperature of air returned from the climate controlled space 160 back to the CCU 165, a humidity within the climate controlled space 160, etc.) and communicate climate control data to the climate controller 175. The one or more climate control sensors can be positioned at various locations outside the truck 150 and/or inside the truck 150 (including within the climate controlled space 160).

The climate controller 175 is configured to control operation of the transport climate control system 155 including components of the climate control circuit. The climate controller 175 may include a single integrated control unit 175 or may include a distributed network of climate controller elements 175, 180. The number of distributed control elements in a given network can depend upon the particular application of the principles described herein. The measured parameters obtained by the one or more climate control sensors can be used by the climate controller 175 to control operation of the climate control system 155.

The truck 150 includes an independent sensor 185. In the illustrated embodiment, the independent sensor 185 is represented as a single sensor. It will be appreciated that in other embodiments, the truck 150 includes a plurality of independent sensors 185. In some embodiments, the independent sensor 185 is a dedicated regulatory sensor that can provide independent verification of climate control parameters (e.g., temperature, humidity, atmosphere, etc.) within the climate controlled space 160. The independent sensor 185 is not used by the climate controller 175 to control operation of the transport climate control system 155. The independent sensor 185 is in electronic communication with a power source (not shown) of the CCU 165. In an embodiment, the independent sensor 185 is in electronic communication with the climate controller 175. It will be appreciated that the electronic communication between the independent sensor 185 and the climate controller 175 can enable network communication of the sensed verification values or parameters (e.g., temperature data of cargo stored in the climate controlled space 300) measured by the independent sensor 185. The electronic communication between the climate controller 175 and the independent sensor 185 does not enable the sensed verification values or parameters to be utilized in a control of the CCU 165.

FIG. 1C illustrates one embodiment of the climate controlled transport unit 200 attached to a tractor 205. The climate controlled transport unit 200 includes a transport climate control system 210 for a transport unit 215. The tractor 205 is attached to and is configured to tow the transport unit 215. The transport unit 215 shown in FIG. 1C is a trailer.

The transport climate control system 210 includes a CCU 220 that provides environmental control (e.g. temperature, humidity, air quality, etc.) within a climate controlled space 225 of the transport unit 215. The CCU 220 is disposed on a front wall 230 of the transport unit 215. In other embodiments, it will be appreciated that the CCU 220 can be disposed, for example, on a rooftop or another wall of the transport unit 215. The CCU 220 includes a climate control circuit (see e.g., FIG. 2) that connects, for example, a compressor, a condenser, an evaporator, and an expansion device to provide conditioned air within the climate controlled space 225. In an embodiment, the CCU 220 can be a transport refrigeration unit.

The transport climate control system 210 also includes a programmable climate controller 235 and one or more sensors (not shown) that are configured to measure one or more parameters of the transport climate control system 210 (e.g., an ambient temperature outside of the transport unit 215, an ambient humidity outside of the transport unit 215, a compressor suction pressure, a compressor discharge pressure, a supply air temperature of air supplied by the CCU 220 into the climate controlled space 225, a return air temperature of air returned from the climate controlled space 225 back to the CCU 220, a humidity within the climate controlled space 225, etc.) and communicate climate control data to the climate controller 235. The one or more climate control sensors can be positioned at various locations outside the transport unit 200 and/or inside the transport unit 200 (including within the climate controlled space 225).

The climate controller 235 is configured to control operation of the transport climate control system 210 including components of the climate control circuit. The climate controller 235 may include a single integrated control unit 240 or may include a distributed network of climate controller elements 240, 245. The number of distributed control elements in a given network can depend upon the particular application of the principles described herein. The measured parameters obtained by the one or more climate control sensors can be used by the climate controller 235 to control operation of the climate control system 210.

The climate controlled transport unit 200 includes an independent sensor 250. In the illustrated embodiment, the independent sensor 250 is represented as a single sensor. It will be appreciated that in other embodiments, the climate controlled transport unit 200 can include a plurality of independent sensors 250. In some embodiments, the independent sensor 140 is a dedicated regulatory sensor that can provide independent verification of climate control parameters (e.g., temperature, humidity, atmosphere, etc.) within the climate controlled space 225. The independent sensor 250 is not used by the climate controller 235 to control operation of the transport climate control system 210. The independent sensor 250 is in electronic communication with a power source (not shown) of the CCU 220. In an embodiment, the independent sensor 250 is in electronic communication with the climate controller 235. It will be appreciated that the electronic communication between the independent sensor 250 and the climate controller 235 can enable network communication of the sensed verification values or parameters (e.g., temperature data of cargo stored in the climate controlled space 300) measured by the independent sensor 250. The electronic communication between the climate controller 235 and the independent sensor 250 does not enable the sensed verification values or parameters to be utilized in a control of the CCU 220.

FIG. 1D illustrates an embodiment of the climate controlled transport unit 275. The climate controlled transport unit 275 includes the multi-zone transport climate control system (MTCS) 280 for a transport unit 285 that can be towed, for example, by a tractor (not shown). It will be appreciated that the embodiments described herein are not limited to tractor and trailer units, but can apply to any type of transport unit (e.g., a truck, a container (such as a container on a flat car, an intermodal container, a marine container, a rail container, etc.), a box car, a semi-tractor, a bus, or other similar transport unit), etc.

The MTCS 280 includes a CCU 290 and a plurality of remote units 295 that provide environmental control (e.g. temperature, humidity, air quality, etc.) within a climate controlled space 300 of the transport unit 275. The climate controlled space 300 can be divided into a plurality of zones 305. The term "zone" means a part of an area of the climate controlled space 300 separated by walls 310. The CCU 290 can operate as a host unit and provide climate control within a first zone 305a of the climate controlled space 300. The remote unit 295a can provide climate control within a second zone 305b of the climate controlled space 300. The remote unit 295b can provide climate control within a third zone 305c of the climate controlled space 300. Accordingly, the MTCS 280 can be used to separately and independently control environmental condition(s) within each of the multiple zones 305 of the climate controlled space 300.

The CCU 290 is disposed on a front wall 315 of the transport unit 275. In other embodiments, it will be appreciated that the CCU 290 can be disposed, for example, on a rooftop or another wall of the transport unit 275. The CCU 290 includes a climate control circuit (see, e.g., FIG. 2) that connects, for example, a compressor, a condenser, an evaporator, and an expansion device to provide conditioned air within the climate controlled space 300. The remote unit 295a is disposed on a ceiling 320 within the second zone 305b and the remote unit 295b is disposed on the ceiling 320 within the third zone 305c. Each of the remote units 295a, b include an evaporator (not shown) that connects to the rest of the climate control circuit provided in the CCU 290. In an embodiment, the CCU 290 can be a transport refrigeration unit.

The MTCS 280 also includes a programmable climate controller 325 and one or more climate control sensors (not shown) that are configured to measure one or more parameters of the MTCS 280 (e.g., an ambient temperature outside of the transport unit 275, an ambient humidity outside of the transport unit 275, a compressor suction pressure, a compressor discharge pressure, supply air temperatures of air supplied by the CCU 290 and the remote units 295 into each of the zones 305, return air temperatures of air returned from each of the zones 305 back to the respective CCU 290 or remote unit 295a or 295b, a humidity within each of the zones 305, etc.) and communicate climate control data to a climate controller 325. The one or more climate control sensors can be positioned at various locations outside the transport unit 275 and/or inside the transport unit 275 (including within the climate controlled space 300).

The climate controller 325 is configured to control operation of the MTCS 280 including components of the climate control circuit. The climate controller 325 may include a single integrated control unit 330 or may include a distributed network of climate controller elements 330, 335. The number of distributed control elements in a given network can depend upon the particular application of the principles described herein. The measured parameters obtained by the one or more climate control sensors can be used by the climate controller 325 to control operation of the MTCS 280.

The climate controlled transport unit 275 includes an independent sensor 340. In the illustrated embodiment, the independent sensor 340 is represented as a single sensor. It will be appreciated that in other embodiments, the climate controlled transport unit 275 can include a plurality of independent sensors 340. In some embodiments, the independent sensor 340 is a dedicated regulatory sensor that can provide independent verification of climate control parameters (e.g., temperature, humidity, atmosphere, etc.) within the climate controlled space 300. The independent sensor 340 is not used by the climate controller 325 to control operation of the MTCS 280. The independent sensor 340 is in electronic communication with a power source (not shown) of the CCU 290. In an embodiment, the independent sensor 340 is in electronic communication with the climate controller 325. It will be appreciated that the electronic communication between the independent sensor 340 and the climate controller 325 can enable network communication of the sensed verification values or parameters (e.g., temperature data of cargo stored in the climate controlled space 300) measured by the independent sensor 340. The electronic communication between the climate controller 325 and the independent sensor 340 does not enable the sensed verification values or parameters to be utilized in a control of the CCU 290. Additional details about the controls are discussed in additional detail in accordance with FIG. 4 below.

In an embodiment, a CCU (e.g., the CCU in FIGS. 1A-1D) can be an electrically powered climate control unit. Also, in an embodiment, the CCU can include a rechargeable energy storage device (not shown) that can provide power to a transport climate control system (e.g., the transport climate control systems in FIGS. 1A-1D). In an embodiment, the rechargeable energy storage device can be charged by AC power (e.g., three-phase AC power, single phase AC power, etc.). In an embodiment, the rechargeable energy storage device can be charged by DC power.

Figure 2:
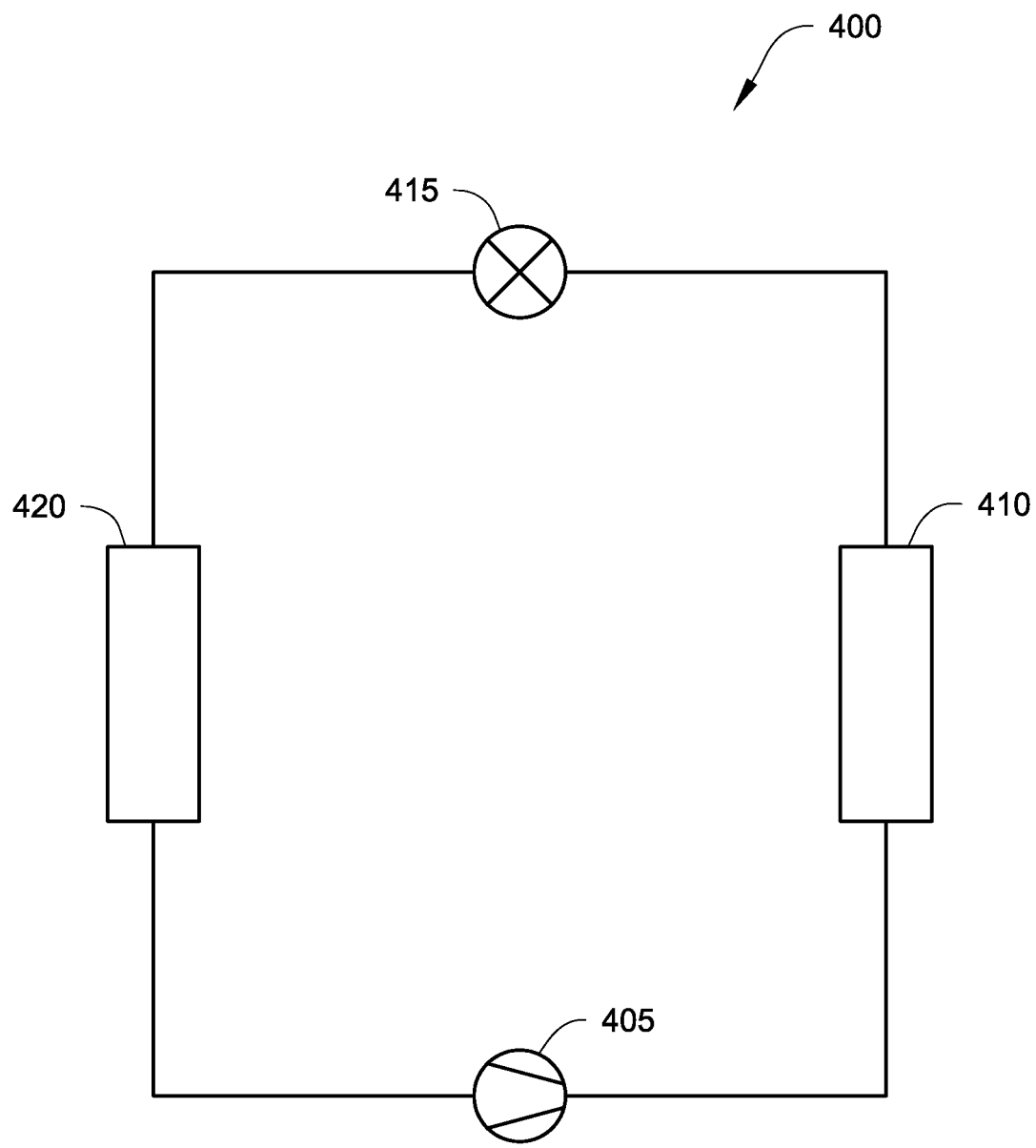
FIG. 2 is a schematic diagram of a climate control circuit, according to an embodiment.

FIG. 2 is a schematic diagram of a climate control circuit 400, according to some embodiments. The climate control circuit 400 generally includes a compressor 405, a condenser 410, an expansion device 415, and an evaporator 420. The compressor 405 can be, for example, a scroll compressor, a reciprocal compressor, or the like. In some embodiments, the compressor 405 can be a mechanically driven compressor. In other embodiments, the compressor 405 can be an electrically driven compressor.

The climate control circuit 400 is exemplary and can be modified to include additional components. For example, in some embodiments the climate control circuit 400 can include an economizer heat exchanger, one or more flow control devices (e.g., valves or the like), a receiver tank, a dryer, a suction-liquid heat exchanger, or the like.

The climate control circuit 400 can generally be applied in a variety of systems used to control an environmental condition (e.g., temperature, humidity, air quality, or the like) in a space (generally referred to as a climate controlled space). Examples of systems include, but are not limited to the climate control systems shown and described above in accordance with FIGS. 1A-1D.

The components of the climate control circuit 400 are fluidly connected. The climate control circuit 400 can be specifically configured to be a cooling system (e.g., an air conditioning system) capable of operating in a cooling mode. Alternatively, the climate control circuit 400 can be specifically configured to be a heat pump system which can operate in both a cooling mode and a heating/defrost mode.

Climate control circuit 400 operates according to generally known principles. The climate control circuit 400 can be configured to heat or cool heat transfer fluid or medium (e.g., a gas such as, but not limited to, air or the like), in which case the climate control circuit 400 may be generally representative of an air conditioner or heat pump.

In operation, the compressor 405 compresses a heat transfer fluid (e.g., refrigerant or the like) from a relatively lower pressure gas to a relatively higher-pressure gas. The relatively higher-pressure and higher temperature gas is discharged from the compressor 405 and flows through the condenser 410. In accordance with generally known principles, the heat transfer fluid flows through the condenser 10 and rejects heat to a heat transfer fluid or medium (e.g., air, etc.), thereby cooling the heat transfer fluid. The cooled heat transfer fluid, which is now in a liquid form, flows to the expansion device 415 (e.g., an expansion valve or the like). The expansion device 415 reduces the pressure of the heat transfer fluid. As a result, a portion of the heat transfer fluid is converted to a gaseous form. The heat transfer fluid, which is now in a mixed liquid and gaseous form flows to the evaporator 420. The heat transfer fluid flows through the evaporator 420 and absorbs heat from a heat transfer medium (e.g., air, etc.), heating the heat transfer fluid, and converting it to a gaseous form. The gaseous heat transfer fluid then returns to the compressor 405. The above-described process continues while the heat transfer circuit is operating, for example, in a cooling mode (e.g., while the compressor 405 is enabled).

Figure 3:
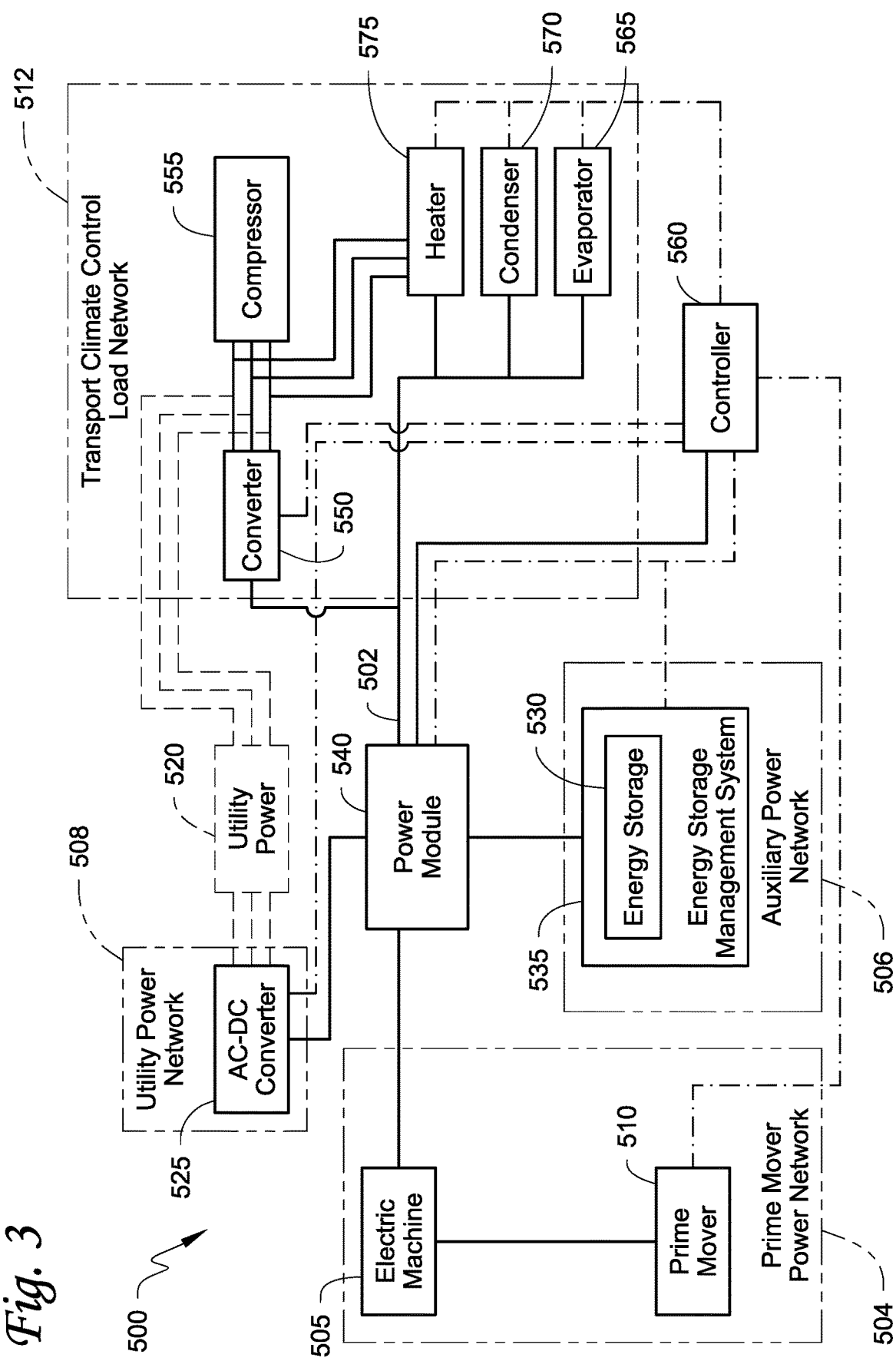
FIG. 3 illustrates a block diagram schematic of one embodiment of a power system for powering a transport climate control system, according to one embodiment.

FIG. 3 illustrates a block diagram schematic of one embodiment of a power system 500 for powering a transport climate control system (e.g., the transport climate control systems 105, 155, 210, 280 shown in FIGS. 1A-1D). The power system 500 includes a prime mover power network 504, an auxiliary power network 506, a utility power network 508, and a transport climate control load network 512 connected to a power module 540. It will be appreciated that in some embodiments, the power system 500 can include one or more of the prime mover power network 504, the auxiliary power network 506, and/or the utility power network 508. For example, in one embodiment, the power system 500 only includes the prime mover power network 504, without the auxiliary power network 506 and/or the utility power network 508. In another embodiment, the power system 500 includes the prime mover power network 504 and the utility power network 508, without the auxiliary power network 506. The power system 500 can use one or more of the prime mover power network 504, the auxiliary power network 506 and the utility power network 508 at any given time to provide power to the transport climate control load network 512. While the power system 500 is configured to be a hybrid power system that is powered by the prime mover power network 504 in combination with the auxiliary power network 506 and/or the utility power network 508. However, it will be appreciated that the embodiments described herein can be used with a fully electric power system that does not include a prime mover or prime mover power network to provide power to the transport climate control system.

The prime mover power network 504 includes a prime mover 510 and an electric machine 505 that can provide electric power to the power module 540. The prime mover 510 is configured to generate mechanical power and the electric machine 510 is configured to convert the mechanical power to electric power. The generated electric power is then sent by the prime mover power network 505 to the power module 540. In some embodiments, the prime mover 510 can be a vehicle prime mover used to move the vehicle that also provides power to the transport climate control load network 512 when available. It will be appreciated that in these embodiments, mechanical power generated by the prime mover 510 that can be used in the system 500 can be inconsistent and based on operation and vehicle load requirements of the vehicle. In other embodiments, the prime mover 510 and the electric machine 505 can be part of a generator set that provides power to the transport climate control load network 512. In yet some other embodiments, the prime mover 510 and the electric machine 505 can be part of a CCU (e.g., the CCU 115, 165, 220, 290 shown in FIGS. 1A-D) to provide power to the transport climate control load network 512. It will be appreciated that in some embodiments the maximum power available from the prime mover power network 504 may never be sufficient to operate the transport climate control system operating at a full capacity.

In some embodiments, the electric machine 505 can be an electrical generator that can provide DC power to the transport climate control load network 512. In some embodiments, the electric machine 505 can include an alternator and a rectifier or an AC-DC converter (not shown) that rectifies or converts the AC power generated by the electric machine 505 to a DC power.

It will be appreciated that when the vehicle is an electric vehicle, there may be no prime mover 510. The electric machine 505 can be a motor generator that is used with a high voltage (e.g., in a range between 60V and 1500V; for example 400V, 800V, etc.) DC battery to run the vehicle. Electric vehicles can also provide a relatively high voltage (e.g., 400V, 800V, etc.) DC power source (e.g., a battery pack, a rechargeable energy storage system (RESS), etc.). Electric vehicles can include one or more DC-DC converters (e.g., two DC-DC convertors) to convert the relatively high voltage (e.g., 400V, 800V, etc.) to a low voltage (e.g., in a range between 0V and 60V; for example 12V). That is, the electric machine 505 can be replaced with a DC-DC converter having similar parameters as the electric machine 505 in order to be able to provide prime mover network power to the power module 540.

In some embodiments, the electric machine 505 can provide a low voltage (e.g. 12V) from the prime mover power network 504 to the power module 540 for powering the transport climate control load network 512. In some embodiments, an electric vehicle can provide for example, 7 kW-Hour energy from a 45 kW-Hour storage of the prime mover power network 504 to the power module 540 to run the transport climate control load network 512. In some embodiments, the prime mover power network 504 can use take off power (e.g., electric power take off or ePTO) from the low voltage (for example, 12V) system for loads such as the power module 540. The high voltage power can provide power for driving the vehicle (e.g., transmission power take off) and the power system 500 but may not take electric power from the high voltage system.

It will be appreciated that in a hybrid vehicle, there may be a machine (such as the electric machine 505) and/or a low voltage DC power source that can provide a low voltage (e.g., 12V) to the power module 540.

It will be appreciated that any type of power source can provide power to the power system 500 and can be part of the prime mover power network 504. This can include, for example, the electric machine 505, a battery, a RESS, a generator, an axle-mounted generator, a power take off (PTO) device or ePTO device with an auxiliary converter, etc.

The auxiliary power network 506 includes an energy storage source 530 and an energy storage management system 535. In some embodiments, the auxiliary power network 506 can be part of the transport climate control system and potentially housed within a CCU. In other embodiments, the auxiliary power network 506 can be external to the transport climate control system and part of the prime mover power network 504. In yet some other embodiments, the auxiliary power network 506 can be external to the transport climate control system and external to the prime mover power network 504.

In some embodiments, the energy storage source 530 can include one or more batteries. For example, in one embodiment the energy storage source 530 can include two batteries (not shown). Each of the batteries can also be connected to the power module 540. It will be appreciated that the energy storage source 530 can provide sufficient energy to power the transport climate control load network 512 by itself. In some embodiments, the energy storage source 530 can provide 12 VDC or 24 VDC. In other embodiments, the energy storage source 530 can provide 48 VDC.

The energy storage management system 535 is configured to monitor a charge level of one or more batteries of the energy storage source 530 and charge the one or more batteries of the energy storage source 530. The energy storage management system 535 can communicate with, for example, the controller 560 and/or a controller (not shown) of the power module 540 to provide a charge level of one or more batteries of the energy storage source 530. Also, the energy storage management system 535 can receive instructions from, for example, the controller 560 and/or the controller of the power module 540 indicating the amount of power from the energy storage source 530 should be supplied to the power module 540.

It will be appreciated that in other embodiments, the energy storage management system 535 can be configured to monitor other parameters (e.g., monitor the fuel levels for an engine-driven system) and communicate the monitored data with, for example, the controller 560 and/or a controller (not shown) of the power module 540.

The power module 540 is configured to convert a power from both of the prime mover power network 504 and the auxiliary power network 506 to a load power compatible with one or more loads of the transport climate control load network 512. The power module 540 can include a high power module (not shown) and a low power module (not shown) that is discussed in more detail below. That is, the power module 540 is configured to buck or boost power from the prime mover power network 504 and is configured to buck or boost power from the auxiliary power network 506 to obtain the desired load power. In some embodiments, the power module 540 can include one or more DC/DC converters. For example, the power module 540 can include one DC/DC converter to convert the power generated by the prime mover power network 504 and/or the auxiliary power network 506 to a voltage compatible with one or more loads of the transport climate control load network 512 and a second DC/DC converter to convert the auxiliary network power to a voltage compatible with one or more loads of the transport climate control load network 512. The converted power from the prime mover power network 504 and the converted power from the auxiliary power network 506 are combined to obtain a load power compatible with one or more loads of the transport climate control load network 512. The load power outputted by the power module 540 can then be provided on a load DC bus 502 to the transport climate control load network 512. In some embodiments, the load power can be a low voltage DC power (e.g., between 0-60V DC). In other embodiments, the load power can be a high voltage DC power (e.g., between 60-1500V DC).

In some embodiments, the power module 540 can include a controller (not shown) configured to monitor and control the power module 540. In some embodiments, the controller can communicate with the controller 560.

The power system 500, and particularly the power module 540, is controlled by the controller 560 of the transport climate control load network 512. The controller 560 can be, for example, the controller 125, 175, 235, 325 shown in FIGS. 1A-D. In some embodiments, the power module 540 can monitor the amount of current and/or voltage provided by the prime mover power network 504. Also, in some embodiments, the power module 540 can monitor the amount of current and/or voltage drawn by components of the transport climate control load network 512. The power module 540 can be configured to communicate the amount of current and/or voltage provided by the prime mover power network 504 and the amount of current and/or voltage drawn by components of the transport climate control load network 512.

Components of the transport climate control load network 512 can be, for example, part of a CCU that is mounted to the body of the vehicle (for example, truck, van, etc.). In some embodiments, the CCU can be above the cab of the truck (as shown in FIG. 1B). In another embodiment, the CCU can be on the top of the TU (for example, a top of a box where the external condensers are located) (see FIG. 1C). In some embodiments, the components of the transport climate control load network 512 can be DC powered components. In some embodiments, the components of the transport climate control load network 512 can be AC powered components. In some embodiments, the transport climate control load network 512 can include both DC powered components and AC powered components.

As shown in FIG. 3, the transport climate control load network 512 includes at least one compressor 555, one or more evaporator blowers 565, one or more condenser fans 570, the heater 575, and the controller 560. It will be appreciated that in some embodiments, the transport climate control load network 512 does not include the heater 575. It will also be appreciated that in some embodiments, the transport climate control load network 512 does not include the at least one compressor 555. It will further be appreciated that in some embodiments, the transport climate control load network 512 can include thermal management of batteries, power electronics, etc. The transport climate control load network 512 also includes an inverter 550 that is configured to boost the load power and convert the boosted load power to an AC load power. That is, the inverter 550 is configured to boost power from the DC load bus 502 and converts the power to AC power to drive the compressor 555. In some embodiments, the inverter 550 can convert the load power to a high voltage AC power. As shown in FIG. 3, the inverter 550 is configured to power the compressor 555 and optionally the heater 575. It will be appreciated that in other embodiments, the inverter 550 can power other components of the transport climate control load network 512 such as, for example, the one or more evaporator blowers 565, the one or more condenser fans 570, etc. In some embodiments, the inverter 550 can be a Compressor Drive Module (CDM).

In some embodiments, the inverter 550 can convert low voltage DC power (for example, 12 VDC, 24 VDC, 48 VDC) from the load DC bus 502 and provide AC power (for example, 530 VAC three phase, 460 VAC three phase, etc.) to drive the compressor 555. In particular, the inverter 550 drives the compressor 555 to meet demand of the transport climate control system.

The load DC bus 502 is connected to and powers each of the inverter 550, the one or more evaporator blowers 565, the one or more condenser fans 570, the heater 575, and the controller 560. It will be appreciated that the inverter 550 with the compressor 555 can require the most power of the various loads of the transport climate control load network 512. As shown in FIG. 3, in some embodiments, the inverter 550 can also power the heater 575.

The utility power network 508 is configured to charge the energy storage source 530 of the auxiliary power network 506 when, for example, the vehicle is parked and has access to a utility power source 520. In some embodiments, the utility power network 508 can also provide power to operate the transport climate control load network 512 when, for example, the vehicle is parked and has access to a utility power source. The utility power network 508 includes the AC-DC converter 525. The utility power source (e.g., shore power, etc.) 520 can be connected to the AC-DC converter 525 to provide AC power input to the AC-DC converter 525. The AC-DC converter 525 is configured to convert the AC power from the utility power source 520 and to provide converted DC power to the power module 540.

While FIG. 3 shows a single AC-DC converter 525 as part of the utility power network 508, it is appreciated that in other embodiments the power system 500 can include two or more AC-DC converters. In embodiments where there are two or more AC-DC converters, each of the AC-DC converters can be connected to the utility power 520 to provide additional power capacity to the power system 500. In some embodiments, each of the AC-DC converters can provide different amounts of power. In some embodiments, each of the AC-DC converters can provide the same amount of power.

In some embodiments, the utility power 520 can be connected directly to the compressor 555 and provide power to drive the compressor 555 thereby bypassing the inverter 550. In some embodiments, the inverter 550 can be used as an AC-DC converter and convert power received from the utility power 520 into DC power that can be provided by the inverter 550 to the load DC bus 502.

In some embodiments, the compressor 555 can be a variable speed compressor. In other embodiments, the compressor 555 can be a fixed speed (e.g., two-speed) compressor. Also, in some embodiments, the heater 575 can be configured to receive power from the inverter 550. While the compressor 555 shown in FIG. 3 is powered by AC power, it will be appreciated that in other embodiments the compressor 555 can be powered by DC power or mechanical power. Further, in some embodiments, the prime mover 510 can be directly connected (not shown) to the compressor 555 to provide mechanical power to the compressor 555.

When the compressor 555 and/or the heater 575 are powered directly by the utility power 520, the compressor 555 and/or the heater 575 can be turned on and off (e.g., operate in a start/stop mode) in order to control the amount of cooling provided by the compressor 555 and/or the amount of heating provided by the heater 575.

The controller 560 is configured to monitor and control operation of the transport climate control system. In particular, the controller 560 can control operation of the compressor 555, the heater 575, the one or more condenser fans 570, the one or more evaporator blowers 565 and any other components of the vehicle powered transport climate control system. In some embodiments, the controller 560 can monitor the amount of power drawn by the components of the transport climate control load network 512. The controller 560 can also be configured to control the power system 500. The power system 500 can also include one or more sensors (not shown) that are configured to measure one or more power parameters (e.g., voltage, current, etc.) throughout the power system 500 and communicate power parameter data to the controller 560. As shown in FIG. 3, the controller 560 can communicate with all of the components of the transport power system 500 via a communication link.

In some embodiments, the controller 560 can be a distributed controller that includes a main application controller (part of the controller 560), a human machine interface (not shown), a telematics unit (not shown), and the power module 540. As noted above, in some embodiments, the power module 540 can include a high power module and a low power module. It will be appreciated that the high power module, the low power module, the main application controller, the telematics unit and the human machine interface can communicate via one or more communication links using one or more protocols including, for example a Controller Area Network (CAN) communication protocol, RS232 communication protocol, RS485 communication protocol, Bluetooth communication protocol, etc. In some embodiments, the controller 560 can also include other modules including, for example, a telematics unit that can provide wireless network connectivity (e.g., cellular, Bluetooth, etc.) that allows the transport climate control system to be controlled remotely.

The main application controller can monitor and operate the transport climate control system (e.g., the transport climate control systems 105, 155, 210, 280 shown in FIGS. 1A-1D). In some embodiments, the power module 540 includes a low power module and a high power module. The high power module can include a processor that can drive inputs and outputs of the high power module. The high power module can condition power (e.g., filter and smooth power) received from, for example, one or more of a battery DC power source (e.g., a battery pack, a rechargeable energy storage system (RESS), etc.) such as the energy storage source 530, as well as from the utility power network 508 via the AC-DC converter 525, the prime mover 510 via the electric machine 505, etc. The high power module can then supply the conditioned power to, for example, the human machine interface, the telematics unit, the low power module, high current components such as a heater, fan(s), the inverter 550, a compressor drive module, etc. An embodiment of the high power module is illustrated in FIG. 4 and discussed below. The low power module can store sensor data prior to being sent to the main application controller and can drive low current components (e.g., digital inputs/outputs, temperature and/or pressure sensors, pressure transducers, throttling valves, solenoid valves, etc.).

Figure 4A:
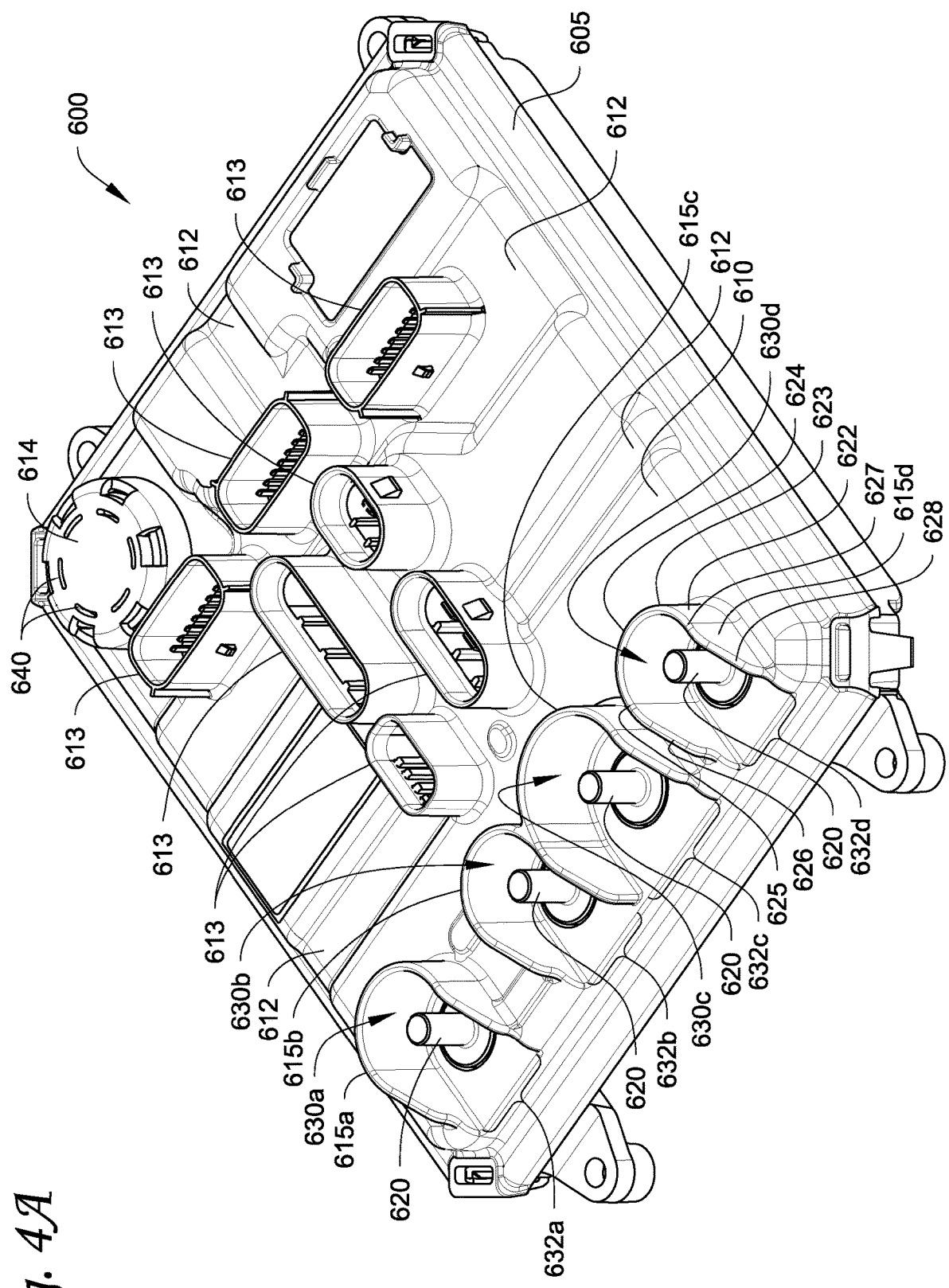
FIGS. 4A and 4B illustrate one embodiment of a high power module of a transport climate control system controller.
Figure 4B:
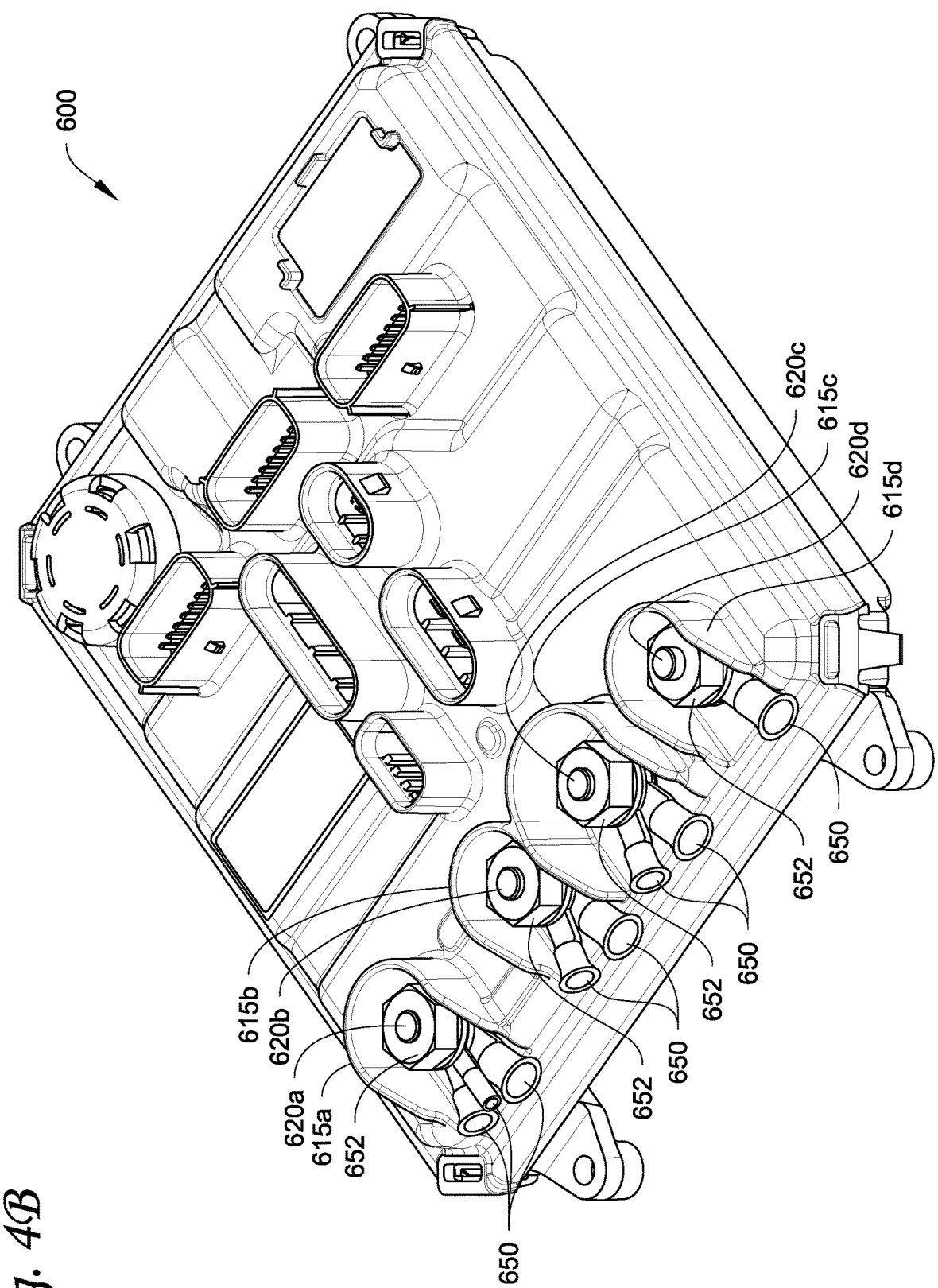

FIGS. 4A and 4B illustrate one embodiment of a high power module 600, according to one embodiment. The high power module 600 includes a power module housing 605 that houses, among other features, a processor, power circuitry, input/output circuitry, a security buzzer, etc. The power module housing 605 includes an external surface 610. The external surface 610 includes a plurality of indentations 612, a plurality of input/output connectors 613, a security buzzer cover 614, and a plurality of power protection shrouds 615. A plurality of power terminals 620 extend through the external surface 610 that allow conditioned power to be supplied to various components such as fan(s), an inverter (e.g., the inverter 550 shown in FIG. 3), etc. FIG. 4A shows the high power module 600 with no power terminal connectors connected to the power terminals 620. As shown in FIG. 4A, each of the power terminals 620 has a cylindrical shape. However, it will be appreciated that in other embodiments, each of the power terminals 620 can have different shapes depending on customer requirements. FIG. 4B shows the same high power module 600 with a plurality of power terminal connectors 650 connected to the power terminals 620. A plurality of connector nuts 652 are also provided to secure the power terminal connectors 650 to the respective power terminals 620. It will be appreciated that in other embodiments the connector nuts 652 can be replaced with other securing mechanisms.

The power protection shrouds 615 are provided to protect the power terminals 620 from external damage and, as discussed in more detail below, limit the number of power terminal connectors that can be connected to the power terminals 620. For example, during assembly, the power protection shrouds 615 can protect the power terminals 620 if the high power module 600 were to be dropped. Also, the power protection shrouds 615 can act as a drip shield to prevent and shed a fluid (e.g., water) that drops onto the high power module 600 away from the power terminals 620. Each of the power protection shrouds 615 extends from the external surface 610 and includes a curved wall 622 having a horseshoe shape that surrounds a corresponding power terminal 620. The curved wall 622 includes a curved portion 623 with a top edge 624, a first edge 626 extending from a first end 625 of the top edge 624 to the external surface 610 of the power module housing 605, and a second edge 628 extending from a second end 627 of the top edge 624 to the external surface 610 of the power module housing 605.

The first edge 626 is a beveled edge that tapers from a top of the first end 625 of the curved portion 623 towards the external surface 610 of the power module housing 605. Similarly, the second edge 628 is a second beveled edge that tapers from a top of the second end 627 of the curved portion 623 towards the external surface 610 of the power module housing 605.

The curved wall 622 forms the horseshoe shape of the power protection shroud 615 and defines a cavity 630 from which the power terminal 620 extends within. The curved wall 622 also defines a gap 632 between the first edge 626 and the second edge 628 that is configured to limit the number of power terminal connectors 650 connected to the respective power terminal 620. For example, in the embodiment shown in FIGS. 4A and 4B, the gap 632a of the power protection shroud 615a allows only up to three power terminal connectors 650 to be connected to the respective power terminal 620a. The gap 632b of the power protection shroud 615b allows only up to two power terminal connectors 650 to be connected to the respective power terminal 620b. The gap 632c of the power protection shroud 615c allows only up to three power terminal connectors 650 to be connected to the respective power terminal 620c. The gap 632d of the power protection shroud 615d allows only up to two power terminal connectors 650 to be connected to the respective power terminal 620d.

Also, the height of each of the power terminal 620 can be configured to restrict the number of power terminal connectors 650 connected to the respective power terminal 620. As shown in FIG. 4A, each of the power terminals 620 protrude in a vertical direction from the external surface 610 up to the same specified distance (i.e., each of the power terminal 620 have the same height). It will be appreciated that in other embodiments, the height of each of the power terminal 620 can vary as required to limit the number of power terminal connectors 650 that can be connected to the respective power terminal 620. It will be appreciated that the height of each of the power terminals 620 does not extend beyond the height of the corresponding power protection shroud 615. That is, the height of each of the power terminals 620 is the same as or shorter than the height of the corresponding power protection shroud 615. If an attempt is made to connect more power terminal connectors 650 to a respective power terminal 620 than the intended limit, the respective connector nut 652 will not have sufficient threading to securely attach to the respective power terminal 620. When the connector nut 652 is not securely attached to the respective power terminal 620, the power terminal connectors 650 connected to the respective power terminal 620 may become dislodged during, for example, transit. Thus, the height of each of the power terminals 620 can restrict the number of power terminal connectors 650 that can be connected to the respective power terminal 620 based on It will be appreciated that the actual number of power terminal connectors 650 connected to the respective power terminal 620 can vary between zero and the maximum number of power terminal connectors allowed based on the respective size of the respective cavity 630, the respective gap 632, and the height of the respective power terminal 620. Thus, as shown for illustrative purposes in FIG. 4B, three power terminal connectors 650 are connected to the power terminal 620a, two power terminal connectors 650 are connected to the power terminal 620b and to the power terminal 620c, and one power terminal connector 650 is connected to the power terminal 620d. Also, while the cavities 630, the gaps 632 and the height of the respective power terminals 620 in the embodiment shown in FIGS. 4A and 4B limit a maximum of two power terminal connectors 650 (e.g., cavities 630b, 630d and gaps 632b, 632d) or a maximum of three power terminal connectors 650 (e.g., cavities 630a, 630c and gaps 632a, 632c) to be connected to the respective power terminal 620, in other embodiments the cavities 630, the gaps 632, and the height of the respective power terminal 620 can be sized to limit the maximum number of power terminal connectors 650 that can be connected to a respective power terminal 620 to any number based on, for example, customer requirements.

By limiting the maximum number of power terminal connectors 650 that can be connected to a particular power terminal 620, a non-designated party can be prevented from connecting additional power terminal connector(s) to the power terminal 620 and thereby divert power from authorized loads to one or more unauthorized loads.

The security buzzer cover 614 covers and protects a speaker (not shown) of the high power module 600. The security buzzer 614 is configured to be securely attached to the external surface 610 and tamper resistant so as to prevent, for example, a needle from being used to break the speaker. The security buzzer cover 614 also is configured to prevent water ingress to the speaker. The security buzzer cover 614 includes include slots that allow sound from the speaker to pass through the security buzzer cover 614.

Each of the indentations 612 are disposed on the external surface 610 and directed from a side of the housing 605 towards one of the input/output connectors 613. The indentations 612 are configured to allow a finger to access each of the input/output connectors 613 to add or remove a connection to the input/output connectors 613.

The input/output connectors 613 include high current connectors 613a that are configured, for example, to drive current to various components of the transport climate control system (e.g., a heater, one or more fans, etc.). High current, as defined herein, can refer to current greater than 5 amps. The input/output connectors 613 also include low current connectors 613b that are configured, for example, to send and receive signals with the low power module, the main application controller, the telematics unit, and the human machine interface. Low current, as defined herein, can refer to current less than 5 amps. In some embodiments, each of the input/output connectors 613 can be keyed and/or offset in a poka-yoke fashion to specific connector cables. This can prevent connector cables from being connected to the wrong input/output connector 613 during, for example, installation or service.

In some embodiments, the high power module 600 can also include one or more light emitting diodes (LEDs) (not shown) that can be viewed from the external surface 610. These LEDs can provide various status states of the high power module to the user. These various status states can include, for example, a power indicator LED, a communication indicator LED, a failure/warning indicator LED, etc.

Aspects:

It is noted that any of aspects 1-8 can be combined with any one of aspects 9-15.

Aspect 1. A power module for a transport climate control system that supplies power to a plurality of components of the transport climate control system, the power module comprising:

a power module housing;

a power terminal extending through an external surface of the power module housing; and a power protection shroud extending from the external surface of the power module housing, wherein the power protection shroud includes a curved wall having a horseshoe shape that surrounds the power terminal.

Aspect 2. The power module of aspect 1, wherein the curved wall of the power protection shroud includes a curved portion with a top edge, a first edge extending from a first end of the top edge to the external surface of the power module housing, and a second edge extending from a second end of the top edge to the external surface of the power module housing.

Aspect 3. The power module of aspect 2, wherein the first edge is a first beveled edge that tapers from a top of the first end of the curved portion towards the external surface of the power module housing, and the second edge is a second beveled edge that tapers from a top of the second end of the curved portion towards the external surface of the power module housing.

Aspect 4. The power module of any one of aspects 2 and 3, wherein the curved wall forming the horseshoe shape of the power protection shroud defines a cavity from which the power terminal extends within, and wherein the curved wall forming the horseshoe shape of the power protection shroud defines a gap between the first edge and the second edge that is configured to limit the number of power terminal connectors connected to the power terminal.

Aspect 5. The power module of any one of aspects 1-4, further comprising a second power terminal extending through the external surface of the power module housing; and a second power protection shroud extending from the external surface of the power module housing, wherein the second power protection shroud has the horseshoe shape that surrounds the second power terminal.

Aspect 6. The power module of any one of aspects 1-5, wherein the power protection shroud prevents more than three power terminal connectors from connecting to the power terminal.

Aspect 7. The power module of any one of aspects 1-6, wherein the power protection shroud prevents more than two power terminal connectors from connecting to the power terminal.

Aspect 8. The power module of any one of aspects 1-7, wherein the power terminal has a cylindrical pin shape.

Aspect 9. A transport climate control system that provides climate control within a climate controlled space of a transport unit, the transport climate control system comprising:

a climate control circuit that includes a compressor that compresses a working fluid passing through the climate control circuit for providing climate control within the climate controlled space of the transport unit;

a transport climate control system controller that controls operation of the transport climate control system including the compressor;

a power module that that supplies power to a plurality of components of the transport climate control system, the power module including:

a power module housing;

a power terminal extending through an external surface of the power module housing; and a power protection shroud extending from the external surface of the power module housing, wherein the power protection shroud includes a curved wall having a horseshoe shape that surrounds the power terminal.

Aspect 10. The power module of aspect 9, wherein the curved wall of the power protection shroud includes a curved portion with a top edge, a first edge extending from a first end of the top edge to the external surface of the power module housing, and a second edge extending from a second end of the top edge to the external surface of the power module housing.

Aspect 11. The power module of aspect 10, wherein the first edge is a first beveled edge that tapers from a top of the first end of the curved portion towards the external surface of the power module housing, and the second edge is a second beveled edge that tapers from a top of the second end of the curved portion towards the external surface of the power module housing.

Aspect 12. The power module of any one of aspects 9-11, wherein the curved wall of the horseshoe shape of the power protection shroud defines a cavity from which the power terminal extends within, and wherein the curved wall of the horseshoe shape of the power protection shroud defines a gap between the first edge and the second edge that is configured to limit the number of power terminal connectors connected to the power terminal.

Aspect 13. The power module of any one of aspects 9-12, further comprising a second power terminal extending through the external surface of the power module housing; and a second power protection shroud extending from the external surface of the power module housing, wherein the second power protection shroud has the horseshoe shape that surrounds the second power terminal.

Aspect 14. The power module of any one of aspects 9-13, wherein the power protection shroud prevents more than three power terminal connectors from connecting to the power terminal.

Aspect 15. The power module of any one of aspects 9-14, wherein the power protection shroud prevents more than two power terminal connectors from connecting to the power terminal.

The terminology used in this Specification is intended to describe particular embodiments and is not intended to be limiting. The terms "a," "an," and "the" include the plural forms as well, unless clearly indicated otherwise. The terms "comprises" and/or "comprising," when used in this Specification, specify the presence of the stated features, integers, steps, operations, elements, and/or components, but do not preclude the presence or addition of one or more other features, integers, steps, operations, elements, and/or components.

With regard to the preceding description, it is to be understood that changes may be made in detail, especially in matters of the construction materials employed and the shape, size, and arrangement of parts without departing from the scope of the present disclosure. This Specification and the embodiments described are exemplary only, with the true scope and spirit of the disclosure being indicated by the claims that follow.

What is claimed is:

1. A power module for a transport climate control system that supplies power to a plurality of components of the transport climate control system, the power module comprising:

a power module housing;

a power terminal extending through an external surface of the power module housing;

a power protection shroud extending from the external surface of the power module housing, wherein the power protection shroud includes a curved wall having a horseshoe shape that surrounds the power terminal;

an input/output connector extending from the external surface of the power module housing, wherein the input/output connector includes a tab disposed along a connector surface of the input/output connector, and wherein the connector surface is perpendicular to the external surface; and an indentation channel extending through the external surface, wherein the indentation channel extends from a bottom edge of the connector surface below the tab to a side of the power module housing, and wherein a width of the indentation channel is configured to allow a finger to access the input/output connector to add or remove a connection to the input/output connector, wherein the curved wall of the power protection shroud includes a curved portion with a top edge, a first edge extending from a first end of the top edge to the external surface of the power module housing, and a second edge extending from a second end of the top edge to the external surface of the power module housing, wherein the first edge is a first beveled edge that tapers from the top edge of the curved portion towards the external surface of the power module housing, and wherein the second edge is a second beveled edge that tapers from top edge of the curved portion towards the external surface of the power module housing, wherein the second edge faces the first edge.

2. The power module of claim 1, wherein the curved wall forming the horseshoe shape of the power protection shroud defines a cavity from which the power terminal extends within, and wherein the curved wall forming the horseshoe shape of the power protection shroud defines a gap between the first edge and the second edge that is configured to limit the number of power terminal connectors connected to the power terminal.

3. The power module of claim 1, further comprising a second power terminal extending through the external surface of the power module housing; and a second power protection shroud extending from the external surface of the power module housing, wherein the second power protection shroud has the horseshoe shape that surrounds the second power terminal.

4. The power module of claim 1, wherein the power protection shroud prevents more than three power terminal connectors from connecting to the power terminal.

5. The power module of claim 1, wherein the power protection shroud prevents more than two power terminal connectors from connecting to the power terminal.

6. The power module of claim 1, wherein the power terminal has a cylindrical pin shape.

7. A transport climate control system that provides climate control within a climate controlled space of a transport unit, the transport climate control system comprising:

a climate control circuit that includes a compressor that compresses a working fluid passing through the climate control circuit for providing climate control within the climate controlled space of the transport unit;

a transport climate control system controller that controls operation of the transport climate control system including the compressor;

a power module that that supplies power to a plurality of components of the transport climate control system, the power module including:

a power module housing;

a power terminal extending through an external surface of the power module housing;

a power protection shroud extending from the external surface of the power module housing, wherein the power protection shroud includes a curved wall having a horseshoe shape that surrounds the power terminal an input/output connector extending from the external surface of the power module housing, wherein the input/output connector includes a tab disposed along a connector surface of the input/output connector, and wherein the connector surface is perpendicular to the external surface; and an indentation channel extending through the external surface, wherein the indentation channel extends from a bottom edge of the connector surface below the tab to a side of the power module housing, and wherein a width of the indentation channel is configured to allow a finger to access the input/output connector to add or remove a connection to the input/output connector, wherein the curved wall of the power protection shroud includes a curved portion with a top edge, a first edge extending from a first end of the top edge to the external surface of the power module housing, and a second edge extending from a second end of the top edge to the external surface of the power module housing, wherein the first edge is a first beveled edge that tapers from the top edge of the curved portion towards the external surface of the power module housing, and wherein the second edge is a second beveled edge that tapers from top edge of the curved portion towards the external surface of the power module housing, wherein the second edge faces the first edge.

8. The transport climate control system of claim 7, wherein the curved wall of the horseshoe shape of the power protection shroud defines a cavity from which the power terminal extends within, and wherein the curved wall of the horseshoe shape of the power protection shroud defines a gap between the first edge and the second edge that is configured to limit the number of power terminal connectors connected to the power terminal.

9. The transport climate control system of claim 7, further comprising a second power terminal extending through the external surface of the power module housing; and a second power protection shroud extending from the external surface of the power module housing, wherein the second power protection shroud has the horseshoe shape that surrounds the second power terminal.

10. The transport climate control system of claim 7, wherein the power protection shroud prevents more than three power terminal connectors from connecting to the power terminal.

11. The transport climate control system of claim 7, wherein the power protection shroud prevents more than two power terminal connectors from connecting to the power terminal.

12. The power module of claim 1, wherein the power terminal is configured to allow conditioned power to be supplied to various components.

13. The transport climate control system of claim 7, wherein the power terminal is configured to allow conditioned power to be supplied to various components.

14. The power module of claim 1, wherein the height of the power terminal is configured to prevent more than three power terminal connectors from connecting to the power terminal.

15. The transport climate control system of claim 7, wherein the height of the power terminal is configured to prevent more than three power terminal connectors from connecting to the power terminal.

16. The power module of claim 1, further comprising a security buzzer cover configured to cover and protect a speaker, wherein the security buzzer cover is securely attached to the external surface, wherein the security buzzer cover is configured to prevent water ingress to the speaker, and wherein the security buzzer cover is configured to be tamper resistant that can prevent a needle being used to break the speaker.

17. The transport climate control system of claim 7, wherein the power module further includes a security buzzer cover configured to cover and protect a speaker, wherein the security buzzer cover is securely attached to the external surface, wherein the security buzzer cover is configured to prevent water ingress to the speaker, and wherein the security buzzer cover is configured to be tamper resistant that can prevent a needle being used to break the speaker.

\* \* \* \* \*